United States Patent
Keong et al.

(10) Patent No.: US 6,177,942 B1
(45) Date of Patent: Jan. 23, 2001

(54) PART DEVELOPMENT SYSTEM

(75) Inventors: Woo Peng Keong; Khoong Hock Yun; Sia Siong Huat; Liau Hon Chung, all of Singapore (SG); Ken Salzberg, Newberg, OR (US)

(73) Assignee: Mentor Graphics Corporation, Wilsonville, OR (US)

( * ) Notice: Under 35 U.S.C. 154(b), the term of this patent shall be extended for 0 days.

(21) Appl. No.: 08/641,191

(22) Filed: Apr. 30, 1996

(51) Int. Cl.[7] ................ G06F 3/00; G06F 19/00
(52) U.S. Cl. .............. 345/356; 345/352; 345/348; 345/440; 700/97
(58) Field of Search ............ 395/701; 700/107; 705/29, 1; 345/352, 348, 356, 440; G06F 3/00, 17/50, 19/00

(56) References Cited

U.S. PATENT DOCUMENTS

| | | | |
|---|---|---|---|
| 4,862,376 | * | 8/1989 | Ferriter et al. ............ 705/29 |
| 5,297,253 | * | 3/1994 | Meisel ................... 345/357 |
| 5,357,440 | * | 10/1994 | Talbott et al. . |
| 5,359,546 | * | 10/1994 | Hayes et al. ............ 702/123 |
| 5,402,358 | * | 3/1995 | Smith et al. . |
| 5,418,728 | * | 5/1995 | Yada ..................... 700/97 |
| 5,500,941 | * | 3/1996 | Gil .................. 395/183.14 |
| 5,517,421 | * | 5/1996 | Jimbo et al. ............ 364/491 |
| 5,519,630 | * | 5/1996 | Nashiyama et al. . |
| 5,555,406 | * | 9/1996 | Nozawa ................. 395/500 |
| 5,563,800 | * | 10/1996 | Matsumoto et al. . |
| 5,566,339 | * | 10/1996 | Perholtz et al. ........ 395/750.08 |
| 5,576,965 | * | 11/1996 | Akasaka et al. ......... 364/468.03 |
| 5,627,949 | * | 5/1997 | Letcher, Jr. ............ 395/120 |
| 5,689,432 | * | 11/1997 | Blaauw et al. . |
| 5,754,760 | * | 5/1998 | Warfield ................ 714/38 |

\* cited by examiner

*Primary Examiner*—James P. Trammell
*Assistant Examiner*—Cuong H. Nguyen
(74) *Attorney, Agent, or Firm*—Klarquist Sparkman Campbell Leigh & Whinston, LLP

(57) ABSTRACT

A part development system implemented on a computer for developing software versions of parts for use in computer-generated designs, such as electrical circuits. The system includes a process developer environment for developing part development processes and a parts developer environment for developing parts in accordance with such processes. In a preferred embodiment, the two environments are implemented as computer programs with graphical interfaces to enable process developers to easily construct part development processes and parts developers to easily develop parts using the processes. The part development processes capture the library and part specifications required for acceptable parts, thus minimizing errors in part creation and time required for test.

19 Claims, 12 Drawing Sheets

PART DEVELOPMENT SYSTEM

FIELD OF THE INVENTION

This invention relates generally to computer-implemented electronic design automation and more particularly to an improved process for developing software versions of parts used in computer-implemented designs.

BACKGROUND OF THE INVENTION

The ability to rapidly develop software versions of parts for use in computer-implemented product designs is critical in today's environment, where the acceptable time from design to market is continually shrinking. These parts are typically contained in computer aided design (CAD) and computer aided engineering (CAE) parts libraries associated with various software design tools. Part development today, however, is a tedious, error prone and inefficient manual process. Errors in the part data, if left uncorrected, can later cause serious problems in the layout and manufacturing of the designed product.

In accordance with the invention, automation of part development brings about greater consistency, improved quality and higher development efficiency in library data. Library standards for parts are sufficiently detailed to cover both data and process information and are included in the part developers' working process. The working process then becomes a repeatable, divisible process whose steps can be divided among several members of a development team, enabling the part development effort to be distributed across multiple user and part supplier sites.

SUMMARY OF THE INVENTION

A part development system according to the invention includes a process developer environment that executes on a computer for developing part development processes and a part development (or part developer) environment that executes on a computer for developing parts in accordance with such processes, the parts development environment having access to the part development processes and responsive to their selection.

The process developer environment can further include means for providing access to part creation processes, the processes having at least one process command; means for providing access to process commands of a part creation process; and means for constructing a menu of the process commands for use with a data object to develop a part.

The part development environment can further include means for selecting a part development process for developing a part; means for providing access to data objects that can be developed into parts with a selected process; means for selecting an accessible data object; and means responsive to selection of a data object for providing a menu of commands that can be selected for use with the data object to develop a part.

Additional features and advantages of the invention will be made apparent from the following detailed description of an illustrated embodiment which proceeds with reference to the accompanying drawings.

DETAILED DESCRIPTION OF A PREFERRED EMBODIMENT

Overview

Figure 1:
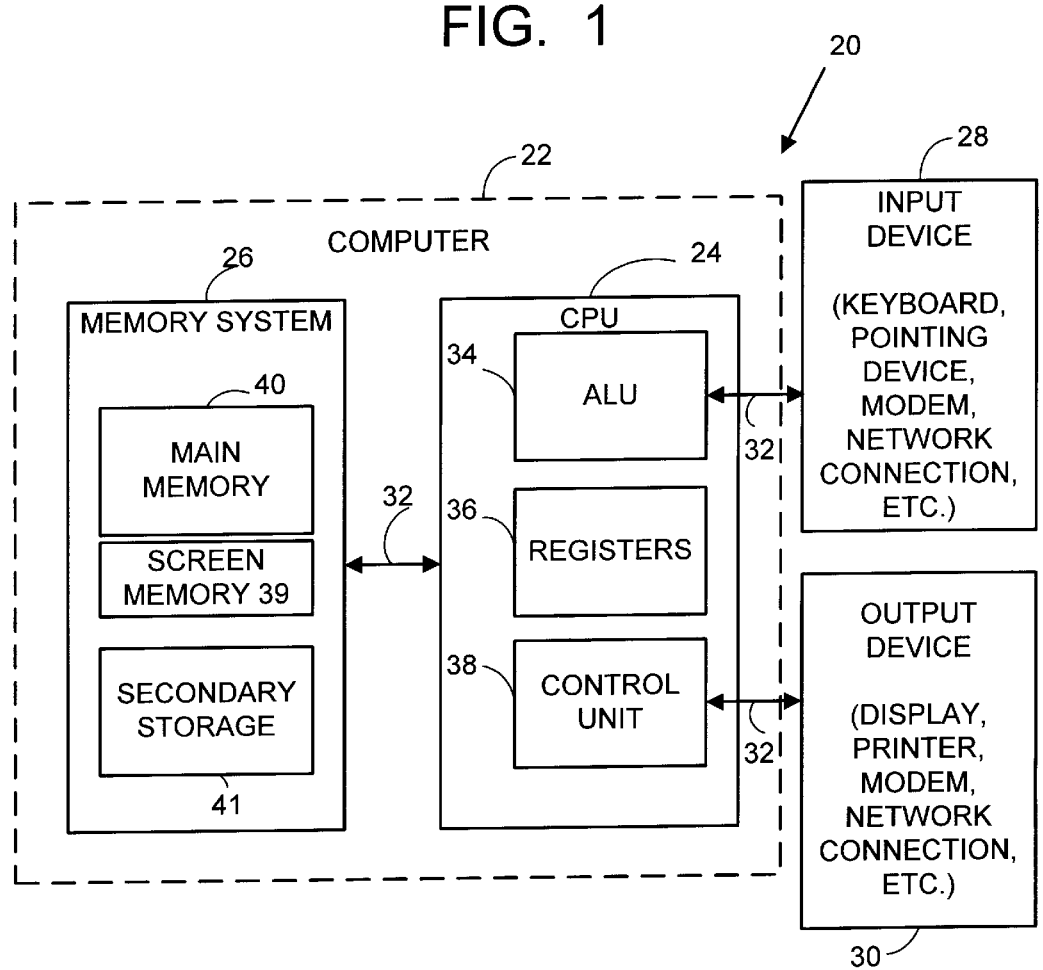
FIG. 1 is a block diagram of a computer system that may be used to implement a method and apparatus embodying the invention.

Referring to FIG. 1, an operating environment for an illustrated embodiment of the present invention is a computer system 20 with a computer 22 that comprises at least one high speed processing unit (CPU) 24, in conjunction with a memory system 26, an input device 28, and an output device 30. These elements are interconnected by at least one bus structure 32.

The illustrated CPU 24 is of familiar design and includes an ALU 34 for performing computations, a collection of registers 36 for temporary storage of data and instructions, and a control unit 38 for controlling operation of the system 20. The CPU 24 may be a processor having any of a variety of architectures now known or contemplated in the art.

The memory system 26 generally includes high-speed main memory 40 in the form of a medium such as random access memory (RAM) and read only memory (ROM) semiconductor devices, and secondary storage 41 in the form of long-term storage mediums such as floppy disks, hard disks, tape, CD-ROM, flash memory, etc. and other devices that store data using electrical, magnetic, optical or other recording media. The main memory 40 also can include video display, or screen, memory 39 for displaying images through a display device. Those skilled in the art will recognize that the memory 26 can comprise a variety of alternative components having a variety of storage capacities.

The input and output devices 28, 30 also are familiar. The input device 28 can comprise a keyboard, a mouse, a physical transducer (e.g., a microphone), etc. The output device 30 can comprise a display, a printer, a transducer (e.g., a speaker), etc. Some devices, such as a network interface or a modem, can be used as input and/or output devices.

As is familiar to those skilled in the art, the computer system 20 further includes an operating system and at least one application program. The operating system is the set of software which controls the computer system's operation and the allocation of resources. The application program is the set of software that performs a task desired by the user, using computer resources made available through the operating system. Both are resident in the illustrated memory system 26.

In accordance with the practices of persons skilled in the art of computer programming, the invention is described below with reference to acts and symbolic representations of operations that are performed by computer system 20, unless indicated otherwise. Such acts and operations are sometimes referred to as being computer-executed or computer-implemented. It will be appreciated that the acts and symbolically represented operations include the manipulation by the CPU 24 of electrical signals representing data bits which causes a resulting transformation or reduction of the electrical signal representation, and the maintenance of data bits at memory locations in memory system 26 to thereby reconfigure or otherwise alter the computer system's operation, as well as other processing of signals. The memory locations where data bits are maintained are physical locations that have particular electrical, magnetic, or optical properties corresponding to the data bits.

A part development system (PDS) in accordance with the invention is preferably embodied as an application program stored in memory system 26 for execution on computer system 20. The PDS captures library standards (data and process information) into a part development tool as process defaults. Process defaults are a set of data that define the default values and operations that are used in the part development process. These defaults can be part of the development tool's commands, scripts or test configuration files. A PDS process allows grouping of commands with pre-selected switches or options to implement the process according to the library standards. In the preferred embodiment the PDS processes are loadable modules that enable rapid deployment of a repeatable process across a user's organization. Remote user sites and parts library suppliers can thus easily obtain the PDS processes for part development.

Figure 2:
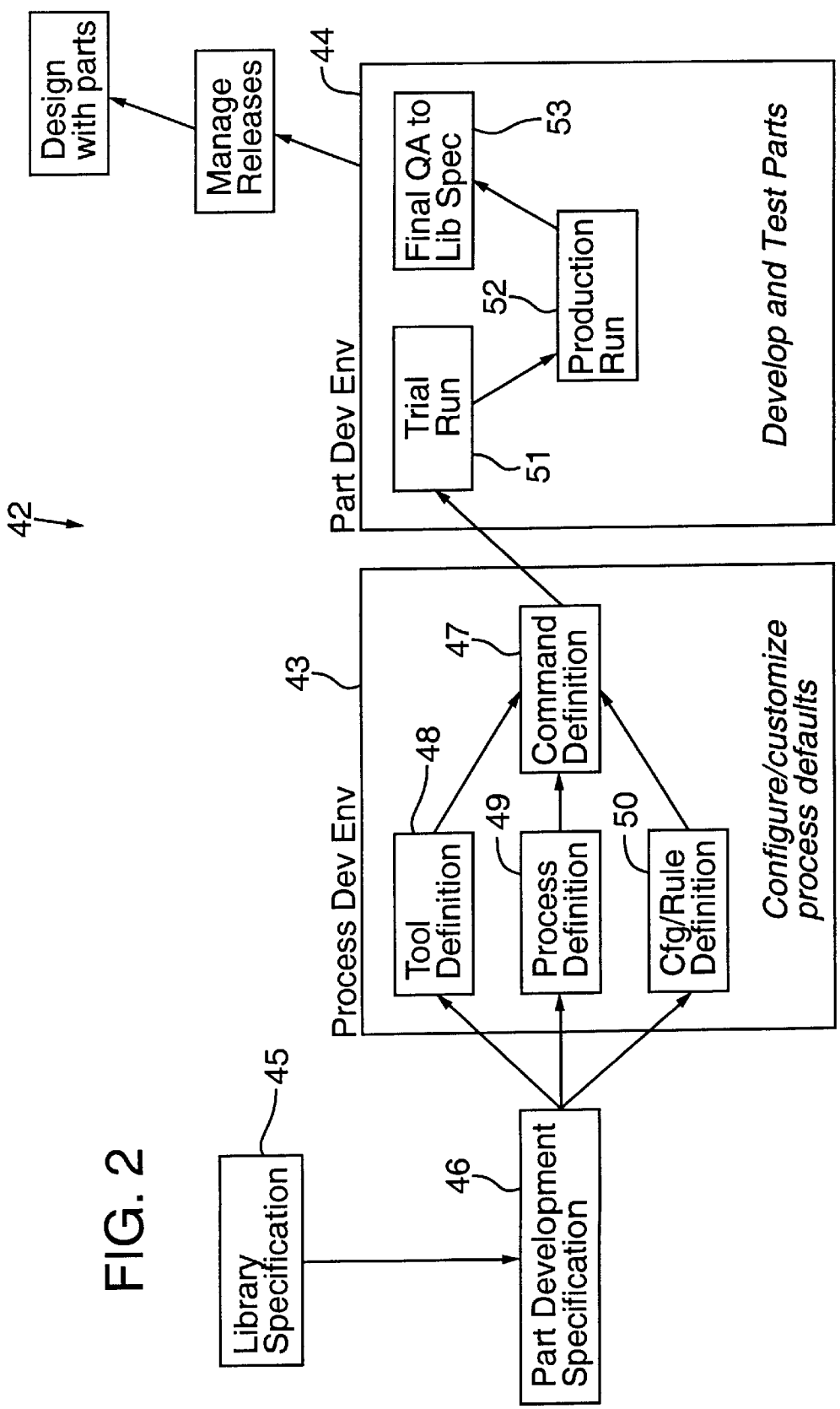
FIG. 2 is a block diagram of a part development system in accordance with the invention.

FIG. 2 is a block diagram of a PDS 42 constructed in accordance with the invention. The PDS has two major sections, or environments: a process developer environment 43 and a part developer environment 44. In the present embodiment environments 43 and 44 are implemented as computer programs that execute on computer system 20. A process developer operates the process developer environment 43 on a computer system to build, customize and maintain part development processes for a part developer. The parts developer then operates the part development environment 44, which has access to completed part development processes, on a computer system to create, maintain and test parts for a computer-implemented design. As will be described, the part development environment provides a developer with access to available processes and responds to the process selected by providing a part developer with an appropriate set of commands. Process development by the process developer can be done at another location and well before part development by the part developer, the part developer needing only access to completed part development processes to proceed.

More particularly, a process developer (individual or team) begins the process development for a part by consulting guidelines known as a library specification 45 and a part development specification 46. The library specification defines the standards that a part must meet for inclusion in the library, such as the different part views (logical, physical, geometrical, etc.). The part development specification specifies the tasks for part development, such as how the process commands should be organized and presented by the part development system to a part developer using PDS. With the information from these specifications at hand, the process developer can then invoke the process development environment 43.

Within the process development environment, a process developer creates numerous process commands (which a part developer will later selectively use for creating various parts). In the context of the part development system 42, a command refers to a process-specific instruction defined by a process developer using the environment 43. A process command is described by its attributes, or command definitions 47. These definitions include a part development tool definition 48, process definition 49 and config/rule definition 50. A process developer uses a tool definition 48 to define the parameters to launch external tools. The tool is then invoked upon selection of the command by a part developer. Such tools may include schematic capture tools, layout tools, simulation tools, etc., whatever types of tools are useful in building and testing parts. The config/rule definition 50 included in the process definition relates to configurations or rules which enable specific implementation of a command to conform to a library specification, without the need to modify part development programs. The process definition 49 contains commands created or selected by the process developer which support part construction, such as commands for building of ANSI symbols, functional models of parts, and printed circuit board (PCB) views.

The command definitions that result are supplied to the part development environment 44, where they can be selected by a part developer via a process. Upon selecting a process, the part developer is provided with the process's associated commands by the environment 44. The part developer then performs three tasks within the part development environment: a trial run 51 (prototyping the task to develop, modify or test the part); a production run 52 of the part, and a final check that the part meets the library specification 53. If these requirements are met, the developer releases the part to the parts library. Design engineers then can begin to design circuits and systems with the new part.

The Process Development Environment

Figure 3:
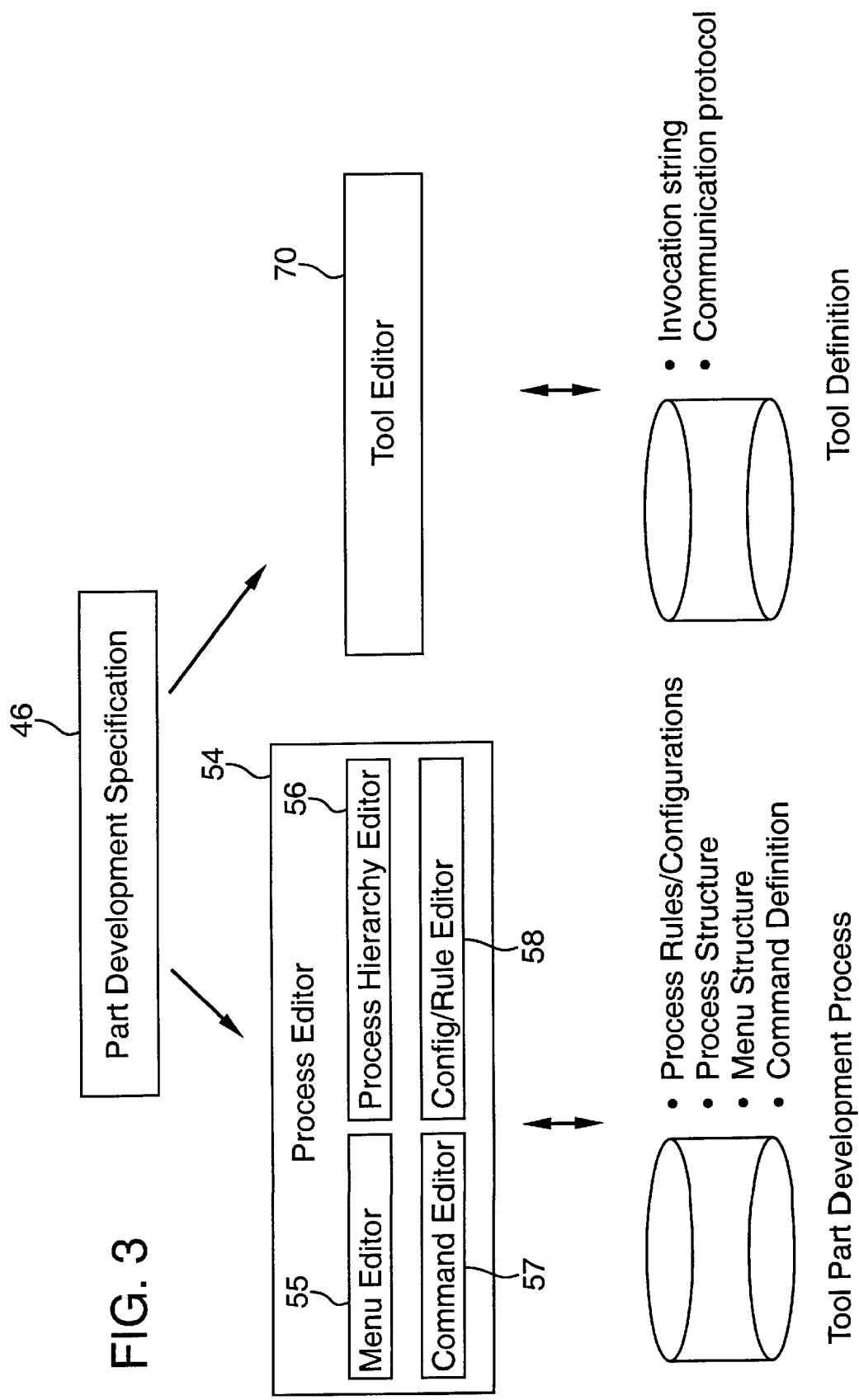
FIG. 3 is a block diagram of a process development environment of the part development system.
Figure 4:
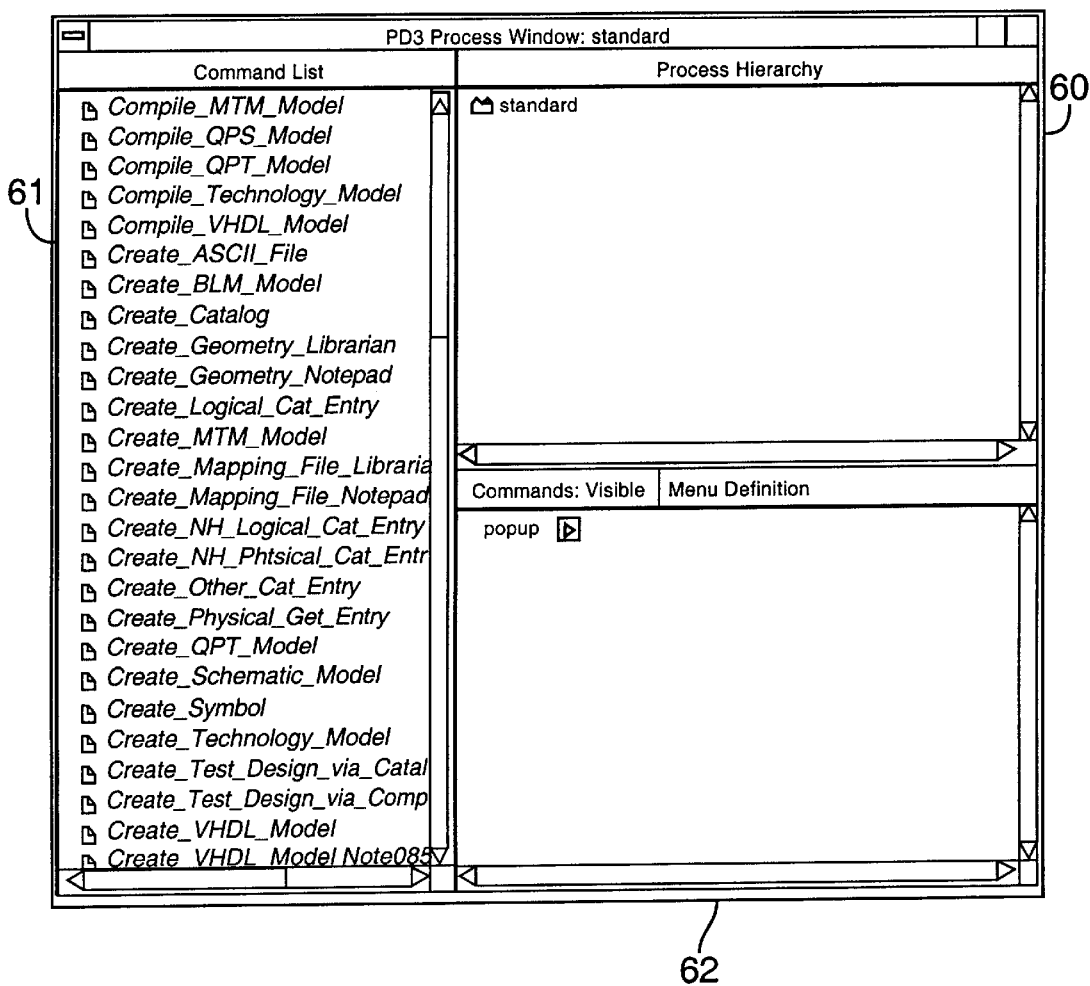
FIG. 4 is a screen view of a process development window in accordance with the invention.

FIG. 3 is a more detailed drawing of a preferred embodiment of the process development environment 43. The environment includes a process editor 54 that is invoked by a process developer to create process commands in accordance with the part development specification 46. In the present embodiment, the editor 54 actually contains four subeditors: a menu editor 55, a process hierarchy editor 56, a command editor 57 and a configuration/rule editor 58. The process editor 54 and its subeditors are accessed through a menu bar that appears on a display screen. By selecting items from the menu bar, different interface windows and dialog boxes are displayed which prompt a process developer for entry of information. The primary window is the process development window 59 shown in FIG. 4.

The process development window has three primary areas: a process hierarchy area 60, a command list area 61 and a menu definition area 62. The process hierarchy area 60 displays the hierarchy of subprocesses and commands for a given process, such as one being developed by the developer. This area includes means for providing access to commands for creating subprocesses, adding commands to subprocesses, and performing edit operations such as cut, copy and paste. In the present embodiment these means include varies graphical interface objects such as dialog boxes and buttons. The command list area 61 displays the commands for the given process. The menu definition area 62 displays the menu hierarchy for the given process for access by a user. This area includes means for providing access to commands for creating menu items, menu title items, and menu separator items. In addition, this area includes means for attaching commands to menu items and for performing edit operations.

The process hierarchy editor 56 enables the process developer to partition and organize the various part development tasks into subprocesses. These subprocesses, while associated with a root process, are independently selected by the part developer, as will be described. Each subprocess is simply a collection of related commands, such as for building a symbol view. By grouping the commands in this way, the process developer makes the task of command selection by a part developer much easier. With the process hierarchy editor 56 a developer can create new subprocesses and add commands to them. The editor includes means for selecting a root process or subprocess in the process hierarchy area and a menu for adding a command or a subprocess to the selected root process or subprocess.

The command editor 57 is a means for defining the content of PDS commands. The editor includes means for selecting a tool for the command, for defining menu activation objects (i.e., parts) and for defining command arguments. Also included are means for defining command scripts, means for defining result directories and means for defining external files. These definitions are created through a series of dialog boxes and windows that appear on the display screen.

Figure 5:
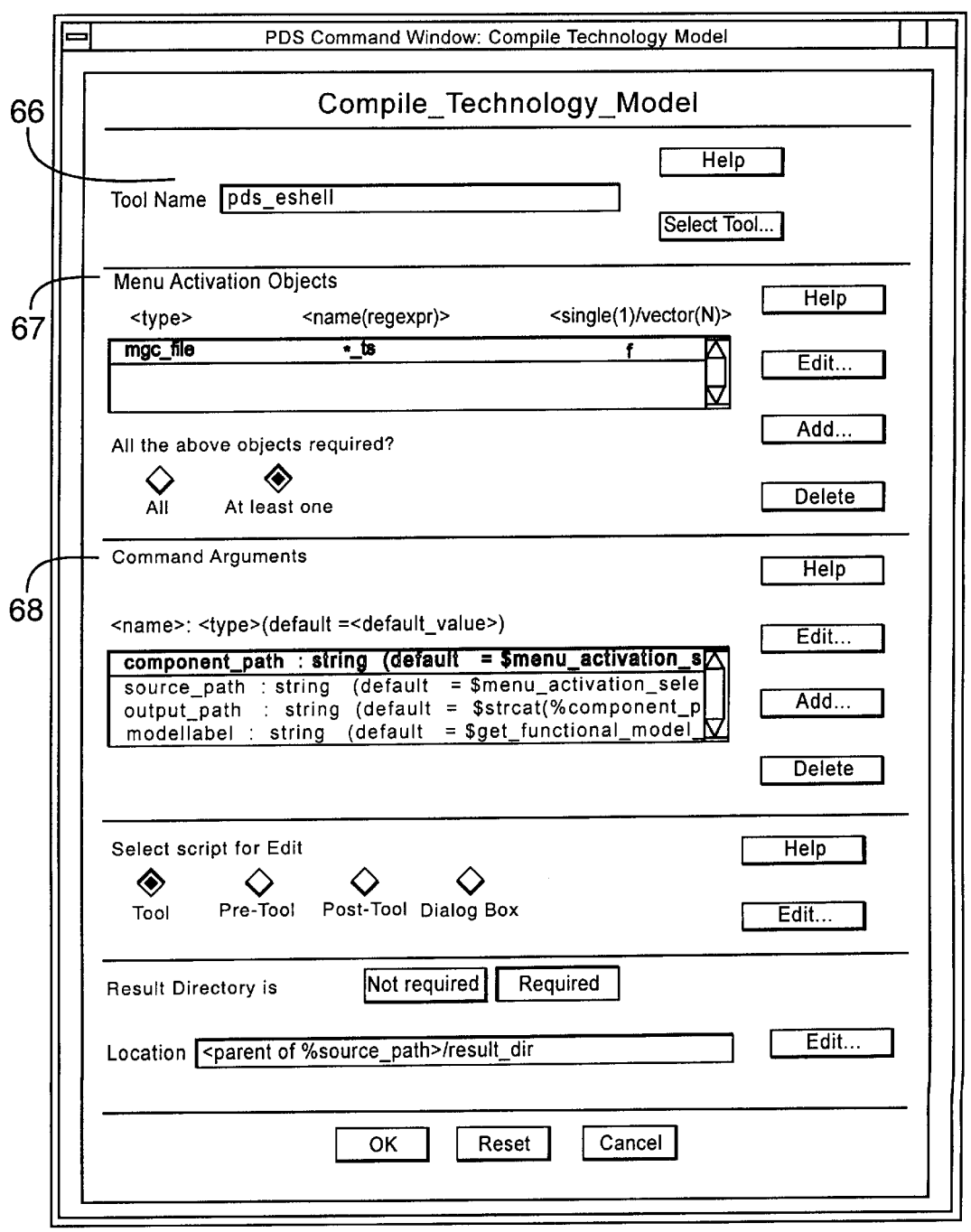
FIG. 5 is a screen view of a PDS command window in accordance with the invention.
Figure 6:
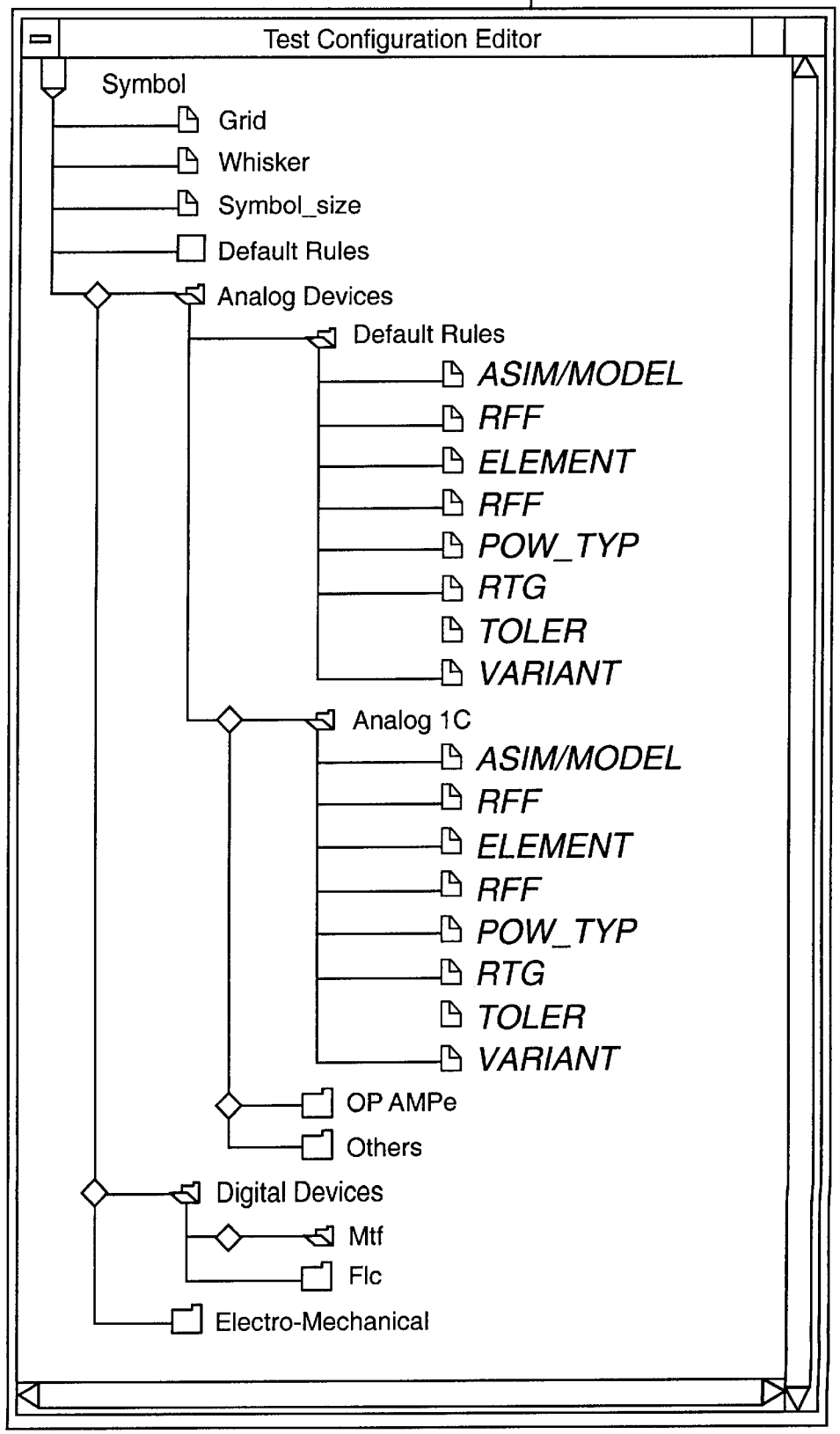
FIG. 6 is a screen view of a test configuration editor in accordance with the invention.

The root window for command definition is the PDS command window 63 shown in FIG. 5. Included therein is a tool definition field 66 that allows a user to select a tool from a list of tools and associate the tool with the command. The tool is then invoked, when required, upon selection of the command. Tools can also be created and connected to the command.

Immediately below field 66 is a menu activation objects field 67 that allows the process developer to control the command's availability to the part developer. This field is a means for associating a data object with a command for making the command available for use upon selection of the data object. By defining menu activation data objects for a command, the command's menu item will not be enabled unless the part developer selects one or more objects (i.e., parts) that match the command's activation criteria. If no menu activation objects are defined for a command, then the command is associated with all accessible data objects and is always enabled in the menus. On the other hand, if only certain data objects are defined for a command, then only those objects are associated with the command. Typically, the menu activation objects for a particular command comprise the set of data objects on which that command will operate the inputs for the command. For example, the Compile-Technology-Model command compiles technology source files, so the command is defined to become active whenever one or more technology source files are selected, and those selected files are used as input arguments to the Compile-Technology-Model command. Referring again to field 67, each entry in the list of menu activation objects is composed of three elements: its registered object type name, a regular expression pattern representing a filename pattern to be matched, and an entry indicating whether the command accepts multiple objects one at a time or as a vector.

A command arguments field 68 of the PDS command window is a means for defining arguments for process commands. Field 68 allows the process developer to define the name, data type and optional default value of each input argument for the command. These arguments can be referenced within any of the command's scripts. These scripts contain the core functionality of and program logic for the command. Each command uses four scripts, each of which is dedicated to a particular stage of command execution. The four stages are "gather input parameters from the user" (dialog box script); "perform a set of operations required before launching the tool" (pre-tool script); "launch and perform a set of operations in the target tool" (tool script); and "perform a set of operations after the tool script finishes" (post-tool script).

More particularly, the scripts have the following functions. The pre-tool script executes before the target tool is launched by selection of the command. It typically checks for error conditions and prepares intermediate data used in the tool script. The tool script embodies the core functionality of the command. It contains the commands/functions to be executed within the target tool, specified in the Tool Name field. These commands/functions may also reference other commands or functions external to the command. The post-tool script executes after completion of the tool script. It can be used to issue messages informing users about the outcome of the command execution or to clean up intermediate data. The optional dialog box script defines a dialog box for gathering command arguments and options from the part developer.

Referring again to FIGS. 3 and 4, the menu editor 55 enables a process developer to define a set of menus for a part developer to access the commands in the part development window. (This window, as noted above, is what a part developer uses to develop a part.) The menu definition area of the process development window 59 is preferably a graphical editor for constructing a diagram of the menu structure and for attaching commands to menu items. The graphical editor uses a series of dialog boxes and other conventional techniques for adding to and editing commands in the menu. PDS then automatically generates corresponding menus when the process is loaded into a part development window.

Figure 7:
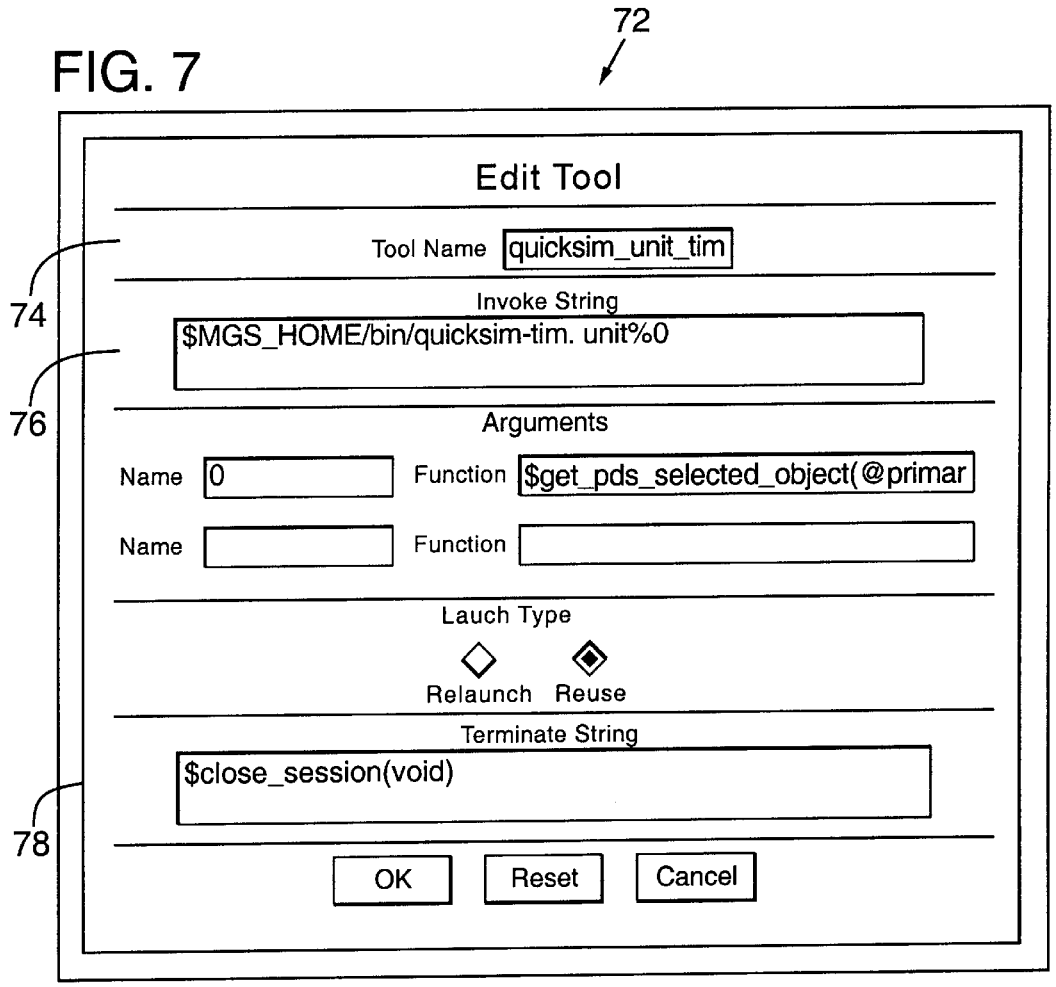
FIG. 7 is a screen view of a tool editor in accordance with the invention.

The config/rule editor 58, the interface window 69 of which is shown in FIG. 7, provides access to rules that capture program parameters required to implement library and process specifications. These include default rules as well as rules entered into PDS through data entry devices.

With editor 58, one can set configuration/rule definition 50 in process development environment 43. Process commands are implemented as three modules: a program, a script and a set of configuration or rule files. The configuration/rule definition 50 allows a set of standard values dictated by the library specification and process specification to be captured as program parameters. Such programs can support different variants of the library specification.- The command provides the user interface to the part developer in the PDS part development window. When executed, the command calls the program to perform the actual task. Typically, the commands produce execution reports detailing the results of the execution. Means within PDS 42 define a results directory for storing execution results.

Another portion of the process development environment is the tool definition 48 (FIG. 2). Tool definition refers to defining the parameters for launching external tools by PDS commands. A tool definition includes a specific invocation string for an external tool and applicable input arguments. In FIG. 3, this feature is handled with a tool editor 70. The editor is preferably accessed through a dialog box 72 shown in FIG. 7. The dialog box 72 contains the following pertinent fields: a tool name field 74; an invocation string field 76; and a termination string field 78. Field 74 allows a process developer to name a tool. The invocation string 76 is used to invoke the tool. And the termination string field 78 specifies the function call used to close the tool.

Using the subeditors of the process editor 54 thus produces the following output: process rules/configurations; process structure; menu structure; and command definition. This output is stored on secondary storage 41 such as a disk, as shown in FIG. 3.

The Part Development Environment

Figure 8:
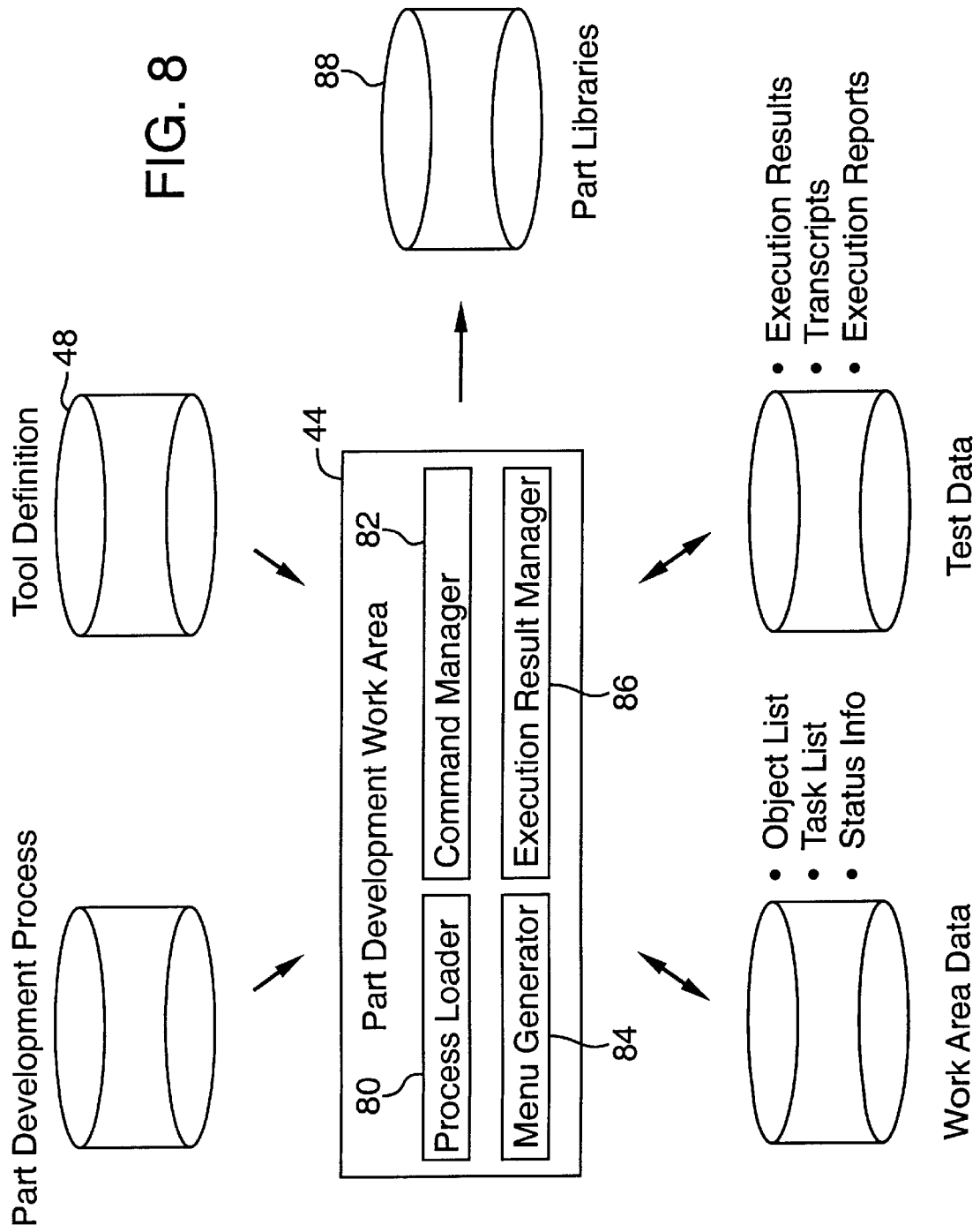
FIG. 8 is a block diagram of a part development environment in accordance with the invention.

A more detailed view of the part development environment 44 is shown in FIG. 8. The input to environment 44 is the processes developed in the part development environment 43. Within environment 44 are a number of features including a process loader 80, a command manager 82, a menu generator 84 and an execution result manager 86. Process loader 80 loads the part development process selected for use in part development (there may be several, including a "standard" process). Command manager 82 gathers the commands associated with the selected process. Menu generator 84 generates the menus that appear with the commands upon selection of a data object (i.e., part being developed), and execution result manager 86 collects the data generated on each part as it is acted on. The output of environment 44 is a part or a view of the part, which is stored in one of the libraries 88.

Figure 9:
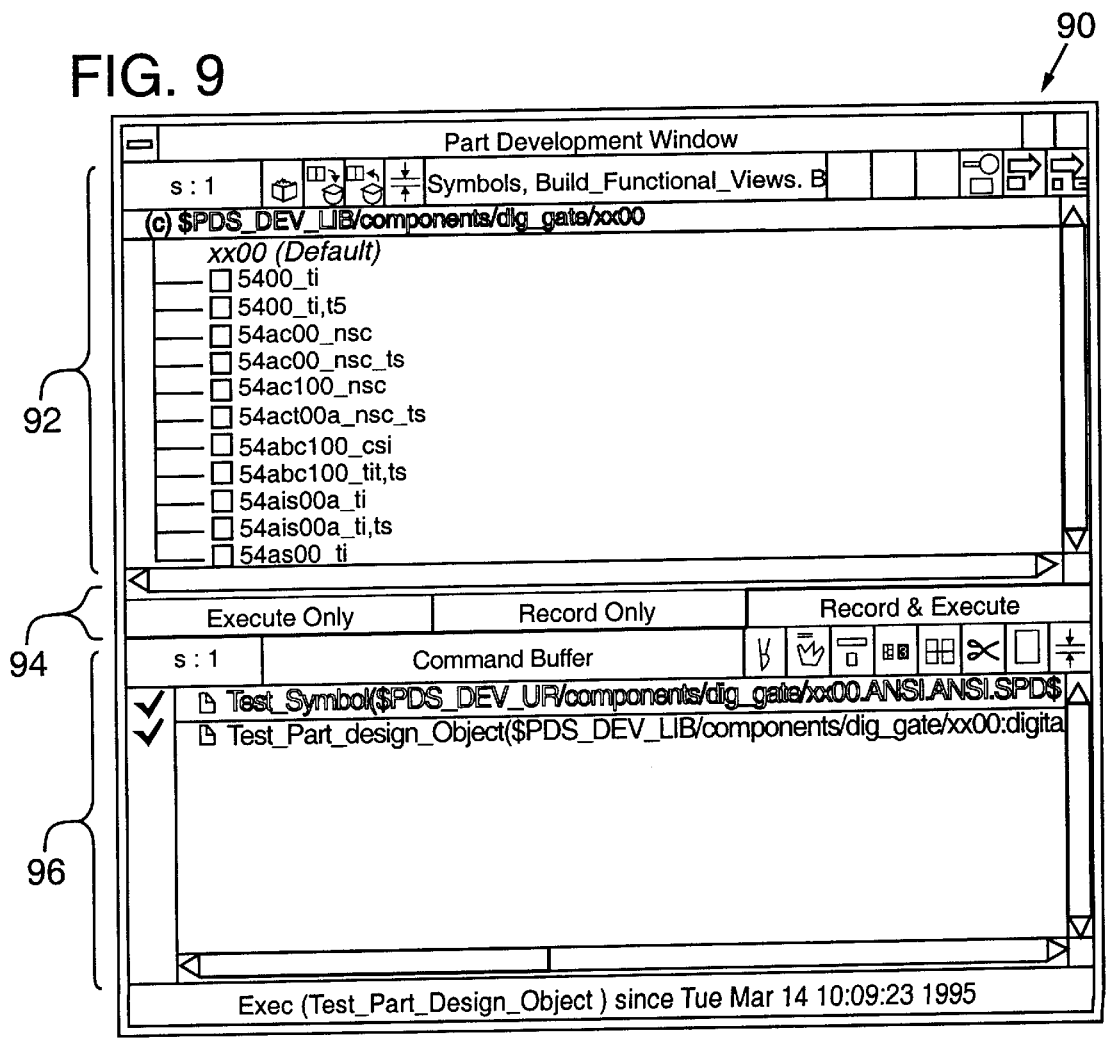
FIG. 9 is a screen view of a part development window in accordance with the invention.
Figure 10:
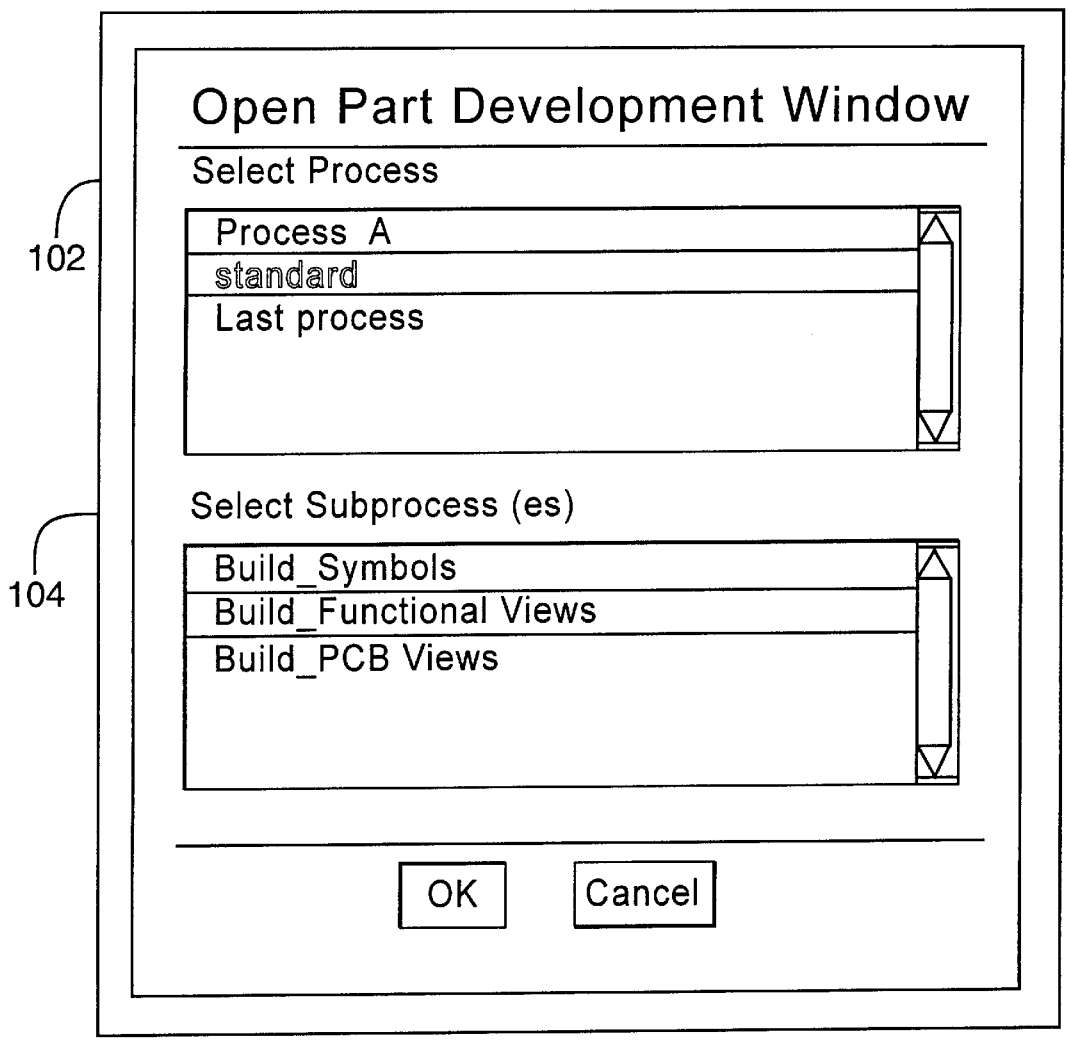
FIG. 10 is a screen view of a dialog box for selecting a process for part development in accordance with the invention.

A user interacts with part development system 42 through a number of interface windows shown in FIGS. 9 and 10 using an input device 28 such as a keyboard or pointing device. The basic interface between a user and environment 44 is a part development window 90 such as shown in FIG. 9. But before window 90 is opened, dialog box 100 shown in FIG. 10 is displayed to enable the user to select the part development process to be used for developing the part. This dialog box is one form of a means for selecting a part development process for developing a part. The processes available include those developed by the process developer using environment 43 in the manner described above and those provided as "standard" with an embodiment of the invention. A Select Process field 102 lists all of the PDS processes available to the user. When a process is selected, its subprocesses are displayed in a Select Subprocess(es) list 104. The user then selects one or more of the subprocesses from list for configuring window 90, each subprocess having associated with it menu items and commands.

Returning to FIG. 9, part development window 90 has three areas of particular interest: an object list area 92, a command mode area 94, and command buffer area 96. Object list area 92 lists data objects which are used to form a part being developed. This area provides access to data objects that can be developed into parts with a selected process. A user selects an object from this area for creating a new part. Command mode area 94 functions as a command mode selector. There are three command mode choices that determine whether the PDS commands invoked from object list area 92 are executed only, recorded only, or record and execute. Command buffer area 96 lists the PDS command invocations that were executed from the object list area 92 menus when the Command Mode was set to either "Record Only" or "Record and Execute." Command buffer 96 is a graphical user interface for modifying and executing recorded commands, viewing execution reports of the recorded commands, and monitoring the execution of recorded commands.

Figure 11:
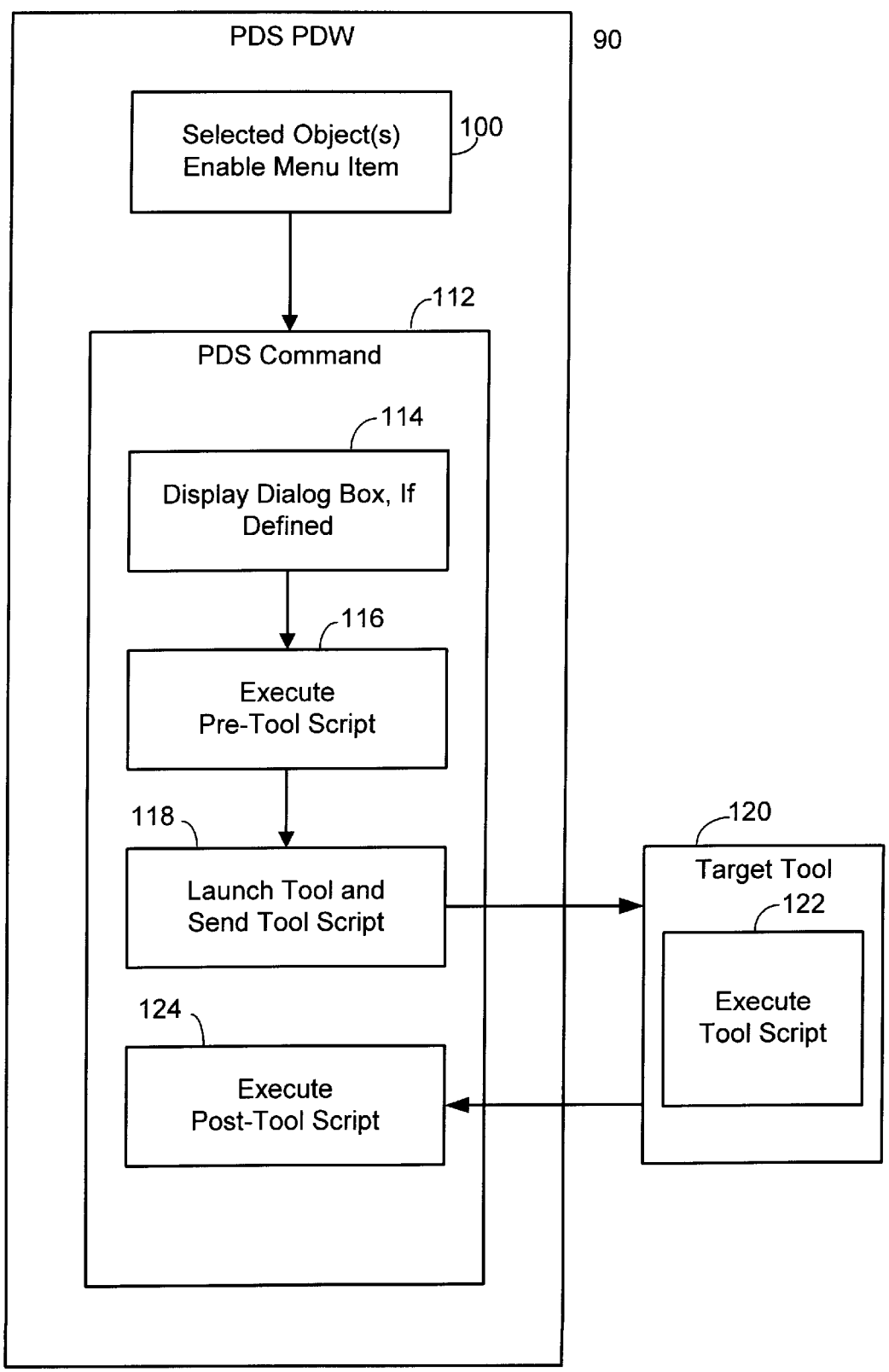
FIG. 11 is flowchart of the stages of execution for a typical command in accordance with the invention.

The user constructs a part by selecting and executing commands provided in the selected process and subprocesses. The stages of a command execution are shown in FIG. 11. In the first stage 110 a menu appears on display 30 in response to selection of a data object from object list area 92. As described above the menu for each data object is restricted to process commands appropriate for the object. In the second stage 112, the user selects a command from the menu, which begins execution upon its selection. In the next stage 114, the command gathers input arguments values, which are derived from the data object in the parts development window 90 and through dialog box interaction with the user. The command then executes the pre-tool script in window 90 (116). Typically, this script verifies and/or computes input argument values for the main tool script. In the following stage 118, the command launches the development tool 120 and sends the tool script to the tool. The tool script then executes in the tool (122). This script can write output data to disk, such as an execution report or results. Upon completion, the tool script returns execution status (passed, failed, error) to the command. In the final stage 124, the command executes the post-tool script in window 90. Typically this script will perform clean-up tasks like deleting temporary files, updating windows or closing windows.

Figure 12:
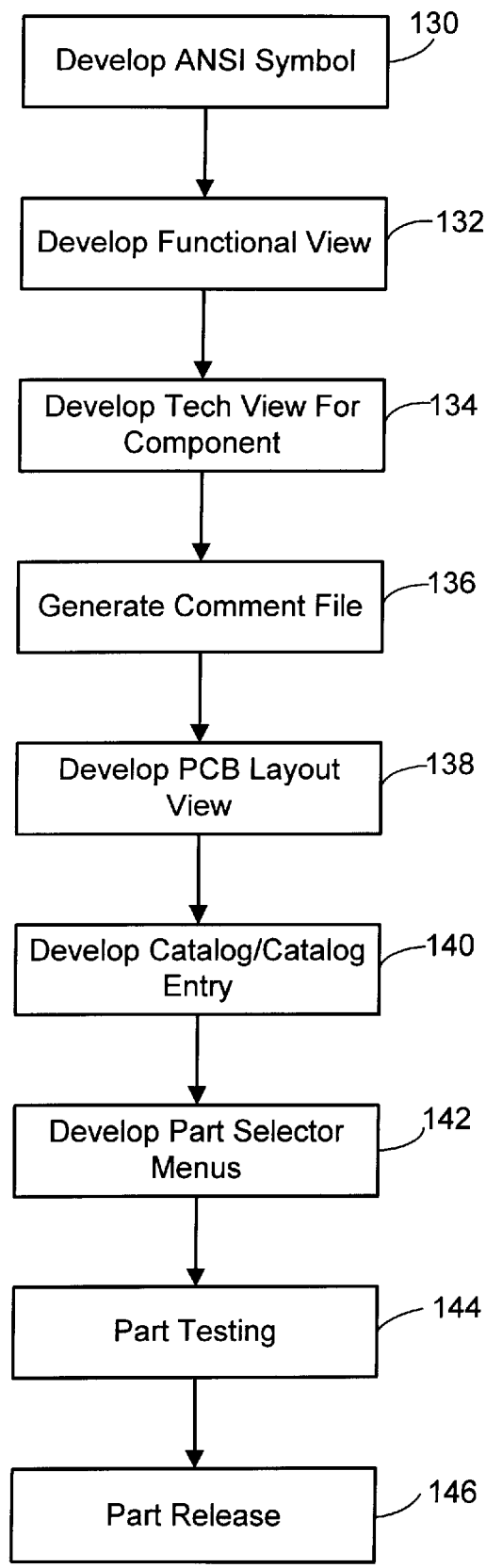
FIG. 12 is flowchart of the steps taken to develop a part in accordance with the invention.

FIG. 12 is a flowchart of the typical tasks undertaken by a user in developing a part with the part development window 90. The first step 130 is to develop a symbol for the part. The user selects a data object of interest from object list area 92. If a symbol does not exist, the user selects a "create symbol" command from the menu. This command, in turn, launches a symbol generator or other tool that enables the user to create a desired symbol. Similarly, if the data object has a symbol that is suitable if modified, the user selects a "modify symbol" command. The next step 132 is to develop a functional view of the part. A functional view is normally associated with the selected data object; but, if not, the user can create the object's function through the use of a selected functional view generator. In step 134, the user creates a technology view of the part. In step 136, the user can create a comment file for the part. In step 138, the user develops a geometric view of the part. This view may be created or edited from an existing data object. This step will invoke the appropriate tool. In steps 140 and 142, the user develops a catalog/catalog entry for the part and creates a part selector menu from which a designer can select the part.

Having described and illustrated the principles of our invention with reference to an illustrated embodiment, it will be recognized that the illustrated embodiment can be modified in arrangement and detail without departing from such principles. It should be understood that the programs, processes, or methods described herein are not related or limited to any particular type of computer apparatus, unless indicated otherwise. Various types of general purpose or specialized computer apparatus may be used with or perform operations in accordance with the teachings described herein. Elements of the illustrated embodiment shown in software may be implemented in hardware and vice versa.

In view of the many possible embodiments to which the principles of our invention may be applied, it should be recognized that the detailed embodiments are illustrative only and should not be taken as limiting the scope of our invention. Rather, we claim as our invention all such embodiments as may come within the scope of the following claims.

We claim:

1. A part development system implemented on a computer, comprising:

(a) a process developer environment that develops software versions of parts for use in computer-generated electronic circuit designs by developing part development processes including:
  a process hierarchy area generated on a display providing access to part creation processes used for developing software versions of electronic parts, the processes having at least one process command;
  a command list area generated on the display providing access to process commands of a part creation process; and
  a menu definition area generated on the display for constructing a menu of the process commands for use with a data object to develop a part; and
(b) a part development environment that develops software versions of parts for use in computer-generated electronic circuit designs by developing parts using part development processes developed with the process developer environment, the parts developer environment comprising:
  a process selection area generated on a display for selecting a part development process for developing a part;
  an object list area generated on the display providing access lo data objects that can be developed into parts with a selected process;
  a means for selecting a data object; and
  a command area generated on the display providing a menu of commands that can be selected for use with the data object to develop a part.

2. The part development system of claim 1 including means for associating a data object with a command for making the command available for use upon selection of the data object.

3. The part development system of claim 1 including means for associating a part development tool with a command for invoking the tool upon selection of the command.

4. The part development system of claim 3 including means for providing access to a tool invocation script for the part development tool.

5. The part development system of claim 1 including means for defining arguments for process commands.

6. The part development system of claim 1 including means for defining a results directory for storing results produced by process commands.

7. The part development system of claim 1 including means for defining a results directory for storing results produced by test process commands.

8. The part development system of claim 1 including a computer-readable medium for storing instructions of a computer program comprising the processor developer environment and part developer environment.

9. The part development system of claim 1 wherein the part developer environment further comprises:
  means for providing access to a configuration to set program parameters dictated by library and process specifications.

10. The part development system of claim 1 including means for controlling operation of a selected command on a data object to execute only, record only, or execute and record.

11. The part development system of claim 10 including a command buffer for storing recorded commands.

12. The part development system of claim 9 wherein the part developer environment comprises means for managing the execution of a pre-tool script, a tool script and a post-tool script.

13. The part development system of claim 1 including means for launching a development tool associated with a command in response to selection of a command, the tool for operating on the data object.

14. The part development system of claim 1 including means for storing and accessing results of execution in areas defined in the process development environment.

15. The part development system of claim 1 including means for executing the recorded commands in batch fashion.

16. Apparatus comprising:
  a process developer environment that executes on a computer for developing part development processes, such processes used for developing software versions of electronic parts for use in computer-generated electronic circuit designs, the process developer environment including a process hierarchy area generated on a display providing access to part creation processes used for developing software versions of electronic parts, the processes having at least one process command; a command list area generated on the display providing access to process commands of a part creation process; and a menu definition area generated on the display for constructing a menu of the process commands for use with a data object to develop a part.

17. The process developer environment of claim 16 including means for associating a data object with a command for making the command available for use upon selection of the data object.

18. Apparatus comprising:
  a part developer environment that executes on a computer for developing software versions of electronic parts in accordance with part development processes, the parts developer environment including a process selection area generated on a display for selecting a part development process for developing a part; an object list area generated on the display providing access to data objects that can be developed into parts with a selected process; means for selecting a data object; and a command area generated on the display providing a menu of commands that can be selected for use with the data object to develop a part.

19. The part developer environment of claim 17 including means for controlling operation of a selected command on a data object to execute only, record only, or execute and record.

* * * * *

UNITED STATES PATENT AND TRADEMARK OFFICE
CERTIFICATE OF CORRECTION

PATENT NO. : 6,177,942 B1 Page 1 of 1
DATED : January 23, 2001
INVENTOR(S) : Woo Peng Keong et al.

It is certified that error appears in the above-identified patent and that said Letters Patent is hereby corrected as shown below:

<u>Title page,</u>
Item [56], References Cited, U.S. PATENT DOCUMENTS, "5,500,941" reference, change "Gil" to -- Gil, Luis --.

<u>Column 4,</u>
Line 65, change "varies" to -- various --.

<u>Column 6,</u>
Line 53, change "specification.-" to -- specification. --.

<u>Column 9,</u>
Line 12, change "development" to -- developer --;
Line 22, change "lo" to -- to --.

Signed and Sealed this

Fifth Day of July, 2005

JON W. DUDAS
*Director of the United States Patent and Trademark Office*